(12) United States Patent
Lin et al.

(10) Patent No.: US 6,670,226 B2
(45) Date of Patent: Dec. 30, 2003

(54) PLANARIZING METHOD FOR FABRICATING GATE ELECTRODES

(75) Inventors: Yo-Sheng Lin, Nantou (TW); Yi-Ming Sheu, Hsinchu (TW); Da-Wen Lin, Taiping (TW); Chi-Hsun Hsieh, Changhua (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/094,460

(22) Filed: Mar. 8, 2002

(65) Prior Publication Data

US 2003/0170994 A1 Sep. 11, 2003

(51) Int. Cl.⁷ .......................................... H01L 21/8238
(52) U.S. Cl. ....................................................... 438/199
(58) Field of Search ......................................... 438/199

(56) References Cited

U.S. PATENT DOCUMENTS 6,492,217 B1 * 12/2002 Bai et al. ..................... 438/199
6,511,887 B1 * 1/2003 Yu et al. ...................... 438/257
6,528,858 B1 * 3/2003 Yu et al. ...................... 257/493

* cited by examiner

Primary Examiner—David Nelms
Assistant Examiner—Thao P Le
(74) Attorney, Agent, or Firm—Tung & Associates

(57) ABSTRACT

Within a method for fabricating a semiconductor integrated circuit microelectronic fabrication, there is employed a planarizing method for forming, in a self aligned fashion, a patterned second gate electrode material layer laterally adjacent but not over a patterned first gate electrode material layer, such that upon further patterning of the patterned first gate electrode material layer and the patterned second gate electrode material layer there may be formed a first gate electrode over a first active region of a semiconductor substrate and a second gate electrode over a laterally adjacent second active region of the semiconductor substrate. The method is particularly useful within the context of complementary metal oxide semiconductor (CMOS) semiconductor integrated circuit microelectronic fabrications.

15 Claims, 2 Drawing Sheets

PLANARIZING METHOD FOR FABRICATING GATE ELECTRODES

BACKGROUND OF THE INVENTION

1. Field of the Invention

The present invention relates generally to methods for fabricating gate electrodes, for use within devices such as but not limited to field effect transistor (FET) devices. More particularly, the present invention relates to methods for fabricating, with enhanced efficiency and enhanced performance, gate electrodes, for use within devices such as but not limited to field effect transistor (FET) devices.

2. Description of the Related Art

Semiconductor integrated circuit microelectronic fabrications are formed from semiconductor substrates within and upon which are formed semiconductor devices and over which are formed patterned microelectronic conductor layers which are separated by microelectronic dielectric layers.

Common in the art of semiconductor integrated circuit microelectronic fabrication, as fabricated within semiconductor integrated circuit microelectronic fabrications, are field effect transistor (FET) devices. Field effect transistor (FET) devices as fabricated within semiconductor integrated circuit microelectronic fabrications are typically employed as switching devices within semiconductor integrated circuit microelectronic fabrications including but not limited to semiconductor integrated circuit microelectronic memory fabrications, semiconductor integrated circuit microelectronic logic fabrications and semiconductor integrated circuit microelectronic embedded memory and logic microelectronic fabrications.

While field effect transistor (FET) devices are thus desirable in the art of semiconductor integrated circuit microelectronic fabrication and often essential in the art of semiconductor integrated circuit microelectronic fabrication, field effect transistor (FET) devices are nonetheless not entirely without problems in the art of semiconductor integrated circuit microelectronic fabrication. In that regard, it is often difficult within the art of semiconductor integrated circuit microelectronic fabrication, and in particular within the art of complementary metal oxide semiconductor (CMOS) semiconductor integrated circuit microelectronic fabrication, to efficiently fabricate field effect transistor (FET) devices with enhanced performance.

It is thus desirable in the art of semiconductor integrated circuit microelectronic fabrication to provide methods for efficiently fabricating, with enhanced performance, field effect transistor (FET) devices within semiconductor integrated circuit microelectronic fabrications.

It is towards the foregoing object that the present invention is directed.

Various methods have been disclosed within the art of semiconductor integrated circuit microelectronic fabrication, for fabricating, with desirable properties, field effect transistor (FET) devices within semiconductor integrated circuit microelectronic fabrications.

Included among the methods, but not limited among the methods, are methods disclosed within: (1) Yu et al., in U.S. Pat. No. 6,218,234 (a method for integrating the fabrication of a polysilicon capacitor within a semiconductor integrated circuit microelectronic fabrication with the fabrication of a pair of field effect transistor (FET) devices within the semiconductor integrated circuit microelectronic fabrication); and (2) Cheek et al., in U.S. Pat. No. 6,261,885 (a method for fabricating, with controlled dopant diffusion effects, a pair of complementary metal oxide semiconductor (CMOS) field effect transistor (FET) devices within a semiconductor integrated circuit microelectronic fabrication).

Desirable in the art of semiconductor integrated circuit microelectronic fabrication are additional methods and materials which may be employed for fabricating, with enhanced performance, field effect transistor (FET) devices within semiconductor integrated circuit microelectronic fabrications.

It is towards the foregoing object that the present invention is directed.

SUMMARY OF THE INVENTION

A first object of the present invention is to provide a method for fabricating a field effect transistor (FET) device within a semiconductor integrated circuit microelectronic fabrication.

A second object of the present invention is to provide a method in accord with the first object of the present invention, wherein the field effect transistor (FET) device is efficiently fabricated, with enhanced performance, within the semiconductor integrated circuit microelectronic fabrication.

In accord with the objects of the present invention, there is provided by the present invention a method for fabricating a semiconductor integrated circuit microelectronic fabrication.

To practice the method of the present invention, there is first provided a semiconductor substrate having defined therein a first active region laterally adjacent a second active region. There is then formed over the first active region but not over the second active region a patterned first gate electrode material layer having formed aligned thereupon a first planarizing stop layer. There is then formed over the first planarizing stop layer and the second active region a blanket second gate electrode material layer. There is then planarized, while employing a planarizing method in conjunction with the planarizing stop layer, the blanket second gate electrode material layer to form therefrom a patterned second gate electrode material layer laterally adjacent but not over the patterned first gate electrode material layer. Finally, there is then further patterned the patterned first gate electrode material layer and the patterned second gate electrode material layer to form a corresponding first gate electrode over the first active region and a corresponding second gate electrode over the second active region.

The present invention provides a method for fabricating a field effect transistor (FET) device within a semiconductor integrated circuit microelectronic fabrication, wherein the field effect transistor (FET) device is efficiently fabricated, with enhanced performance, within the semiconductor integrated circuit microelectronic fabrication.

The present invention realizes the foregoing object by employing, in part, a planarizing method for forming, in a self aligned fashion, a patterned second gate electrode material layer laterally adjacent but not over a patterned first gate electrode material layer, such that upon further patterning of the patterned first gate electrode material layer and the patterned second gate electrode material layer there may be formed a first gate electrode over a first active region of a semiconductor substrate and a second gate electrode over a laterally adjacent second active region of the semiconductor substrate. Similarly, by employing the foregoing planarizing method in accord with the present invention, each of a blanket first gate electrode material layer from which is formed the patterned first gate electrode material layer and a blanket second gate electrode material layer from which is formed the patterned second gate electrode material layer may be formed employing an in-situ deposition dopant incorporation method, rather than an ion implantation dopant incorporation method, such as to provide for enhanced performance of a pair of field effect transistor (FET) devices within which are formed the first gate electrode and the second gate electrode.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for fabricating a field effect transistor (FET) device within a semiconductor integrated circuit microelectronic fabrication, wherein the field effect transistor (FET) device is efficiently fabricated, with enhanced performance, within the semiconductor integrated circuit microelectronic fabrication.

The present invention realizes the foregoing object by employing, in part, a planarizing method for forming, in a self aligned fashion, a patterned second gate electrode material layer laterally adjacent but not over a patterned first gate electrode material layer, such that upon further patterning of the patterned first gate electrode material layer and the patterned second gate electrode material layer there may be formed a first gate electrode over a first active region of a semiconductor substrate and a second gate electrode over a laterally adjacent second active region of the semiconductor substrate. Similarly, by employing the foregoing planarizing method in accord with the present invention, each of a blanket first gate electrode material layer from which is formed the patterned first gate electrode material layer and a blanket second gate electrode material layer from which is formed the patterned second gate electrode material layer may be formed employing an in-situ deposition dopant incorporation method, rather than an ion implantation dopant incorporation method, such as to provide for enhanced performance of a pair of field effect transistor (FET) devices fabricated employing the first gate electrode and the second gate electrode.

While the preferred embodiments of the present invention illustrate the present invention most particularly within the context of fabricating a pair of field effect transistor (FET) devices within a complementary metal oxide semiconductor (CMOS) semiconductor integrated circuit microelectronic fabrication, the present invention is not intended to be so limited. Rather, the present invention may be employed for fabricating pairs of gate electrodes within semiconductor integrated circuit microelectronic fabrications including but not limited to non-complementary semiconductor integrated circuit microelectronic fabrications and complementary semiconductor integrated circuit microelectronic fabrications.

Referring now to FIG. 1 to FIG. 6, there is shown a series of schematic cross-sectional diagrams illustrating the results of progressive stages of fabricating, in accord with the preferred embodiments of the present invention, a semiconductor integrated circuit microelectronic fabrication having formed therein a pair of field effect transistor (FET) devices in accord with the present invention.

Figure 1:
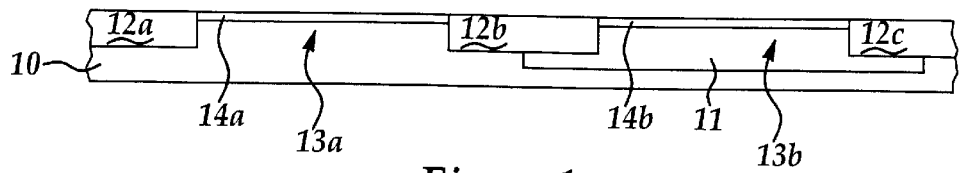
FIG. 1, FIG. 2A, FIG. 2B, FIG. 3A, FIG. 3B, FIG. 4, FIG. 5 and FIG. 6 show a series of schematic cross-sectional diagrams illustrating the results of progressive stages of fabricating, in accord with the preferred embodiments of the present invention, a pair of field effect transistor (FET) devices within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiments of the present invention.

Shown in FIG. 1, in a first instance, is a semiconductor substrate 10 having formed therein a series of isolation regions 12a, 12b and 12c which define a first active region 13a of the semiconductor substrate 10 and a second active region 13b of the semiconductor substrate 10 which are laterally adjacent.

Within the preferred embodiment of the present invention with respect to the semiconductor substrate 10, and although semiconductor substrates are known in the art of semiconductor integrated circuit microelectronic fabrication with various semiconductor materials compositions, either dopant polarity, several dopant concentrations and various crystallographic orientations, for the preferred embodiments of the present invention, the semiconductor substrate 10 is typically and preferably a (100) silicon semiconductor substrate or a (100) silicon-germanium alloy semiconductor substrate of N or P polarity.

Within the preferred embodiment of the present invention with respect to the series of isolation regions 12a, 12b and 12c, and although it is also known in the art of semiconductor integrated circuit microelectronic fabrication that isolation regions may be formed while employing methods including but not limited to isolation region thermal growth methods and isolation region deposition/patterning methods, for the preferred embodiment of the present invention, the series of isolation regions 12a, 12b and 12c is, as is illustrated within the schematic cross-sectional diagram of FIG. 1, formed as a series of shallow trench isolation (STI) regions within and upon the semiconductor substrate 10 to define the first active region 13a of the semiconductor substrate 10 laterally adjacent the second active region 13b of the semiconductor substrate 10.

Shown also within the schematic cross-sectional diagram of FIG. 1, and formed upon each of the corresponding first active region 13a of the semiconductor substrate 10 and second active region 13b of the semiconductor substrate 10 is a corresponding first gate dielectric layer 14a and a corresponding second gate dielectric layer 14b. Similarly, there is also shown within the schematic cross-sectional diagram of FIG. 1, and encompassing the second active region 13b of the semiconductor substrate 10 a doped well region 11.

Within the preferred embodiment of the present invention with respect to the first gate dielectric layer 14a and the second gate dielectric layer 14b, and although it is known in the art of semiconductor integrated circuit microelectronic fabrication that gate dielectric layers may be formed employing methods including but not limited to gate dielectric layer thermal growth methods and gate dielectric layer deposition/patterning methods, for the preferred embodiments of the present invention, both of the first gate dielectric layer 14a and the second gate dielectric layer 14b are typically and preferably formed employing a thermal oxidation method to provide the first gate dielectric layer 14a and the second gate dielectric layer 14b at least in part of silicon oxide dielectric material formed to a thickness of from about 10 to about 50 angstroms upon the corresponding first active region 13a of the semiconductor substrate 10 and second active region 13b of the semiconductor substrate 10.

Finally, within the preferred embodiment of the present invention with respect to the doped well region 11 which encompasses the second active region 13b of the semiconductor substrate 10, the doped well region 11 is of a P or N polarity opposite the N or P polarity of the semiconductor substrate 10 within the first active region 13a of the semiconductor substrate 10.

Figure 2A:
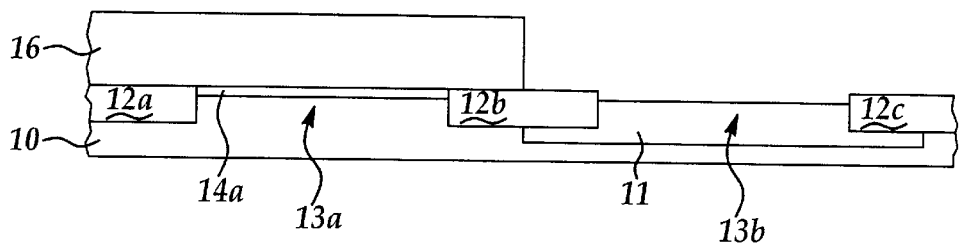

Referring now to FIG. 2A, there is shown a schematic cross-sectional diagram illustrating the results of further processing of the semiconductor integrated circuit microelectronic fabrication whose schematic cross-sectional diagram is illustrated in FIG. 1.

Shown in FIG. 2A is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein, in a first instance, there is formed a patterned first gate electrode material layer 16 upon the first gate dielectric layer 14a and over the first active region 13a of the semiconductor substrate 10, but not the second active region 13b of the semiconductor substrate 10, while spanning over the pair of isolation regions 12a and 12b.

Within the preferred embodiments of the present invention, the patterned first gate electrode material layer 16 may be formed of gate electrode materials as are otherwise conventional in the art of semiconductor integrated microelectronic fabrication, such gate electrode materials including but not limited to metals, metal alloys, doped polysilicon (having a dopant concentration of greater than about 1E20 dopant atoms per cubic centimeter) and polycide (doped polysilicon/metal silicide stack) gate electrode materials. Typically and preferably, the patterned first gate electrode material layer 16 is formed to a thickness of from about 500 to about 3000 angstroms, and formed at least in part of a doped polysilicon gate electrode material of polarity opposite the semiconductor substrate 10. As is understood by a person skilled in the art, the present invention provides particular value insofar as the patterned first gate electrode material layer 16, when formed at least in part of a doped polysilicon gate electrode material, may be formed (and preferably is formed) employing an in-situ deposition dopant incorporation method (i.e., chemical vapor deposition (CVD) co-deposition dopant incorporation method), rather than an ion implantation dopant incorporation method (which is preferably not employed within the present invention). Such provides for enhanced off current (i.e., Ioff) performance, enhanced drain saturation current (i.e., Idsat) performance and possibly enhanced short channel effect (SCE) performance of a field effect transistor (FET) device formed employing a gate electrode formed from the patterned first gate electrode material layer 16.

Shown also within the schematic cross-sectional diagram of FIG. 2, by its absence, is the result of stripping from the second active region 13b of the semiconductor substrate 10 the second gate dielectric layer 14b. Such stripping of the second gate dielectric layer 14b from the semiconductor integrated circuit microelectronic fabrication whose schematic cross-sectional diagram is illustrated in FIG. 1 to provide in part the semiconductor integrated circuit microelectronic fabrication whose schematic cross-sectional diagram is illustrated in FIG. 2 may be effected while employing stripping methods and materials as are: (1) otherwise generally conventional in the art of semiconductor integrated circuit microelectronic fabrication; and (2) otherwise appropriate to the material from which is formed the second gate dielectric layer 14b.

Figure 2B:
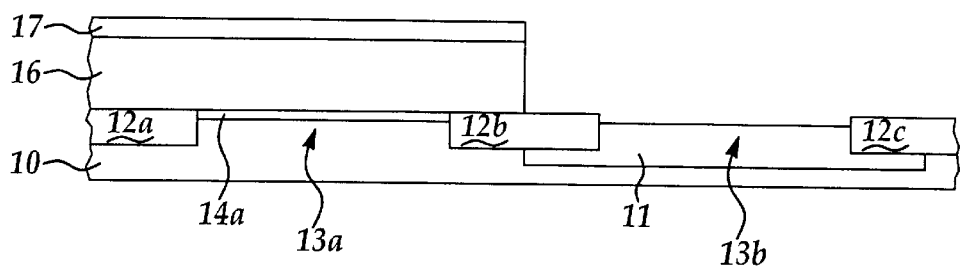

Referring now to FIG. 2B, there is shown a schematic cross-sectional diagram illustrating the results of an alternative further processing of the semiconductor integrated circuit microelectronic fabrication whose schematic cross-sectional diagram is illustrated in FIG. 1.

Similarly with the schematic cross-sectional diagram of FIG. 2A, the alternative further processing of the semiconductor integrated circuit microelectronic fabrication whose schematic cross-sectional diagram is illustrated in FIG. 1 includes: (1) forming the patterned first gate electrode material layer 16 upon the first gate dielectric layer 14a and spanning over the pair of isolation regions 12a and 12b; as well as (2) stripping from the second active region 13b of the semiconductor substrate 10 the second gate dielectric layer 14b. However, the alternative further processing of the semiconductor integrated circuit microelectronic fabrication whose schematic cross-sectional diagram is illustrated in FIG. 1 to provide the semiconductor integrated circuit microelectronic fabrication whose schematic cross-sectional diagram is illustrated in FIG. 2B also provides that there is formed upon the patterned first gate electrode material layer 16 a patterned first planarizing stop layer 17.

Within the preferred embodiment of the present invention, the patterned first planarizing stop layer 17 may be formed from any of several planarizing stop materials as are conventional or unconventional in the art of semiconductor integrated circuit microelectronic fabrication. In particular, such planarizing stop materials may include hard mask materials, such as further in particular silicon nitride hard mask materials and silicon oxynitride hard mask materials. Typically and preferably the patterned first planarizing stop layer 17 is formed to a thickness of from about 50 to about 400 angstroms.

Figure 3A:
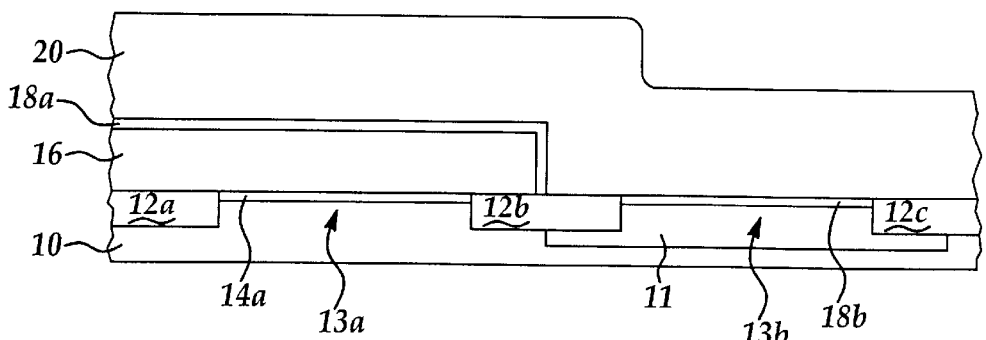

Referring now to FIG. 3A, there is shown a schematic cross-sectional diagram illustrating the results of further processing of the semiconductor integrated circuit microelectronic fabrication whose schematic cross-sectional diagram is illustrated in FIG. 2A.

Shown in FIG. 3A is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2A, but wherein, in a first instance, the semiconductor integrated circuit microelectronic fabrication has been thermally oxidized to form: (1) a conformal first planarizing stop layer 18a upon exposed portions of the patterned first gate electrode material layer 16; and (2) a regrown second gate dielectric layer 18b formed upon the second active region 13b of the semiconductor substrate 10.

Within the preferred embodiments of the present invention, the conformal first planarizing stop layer 18a and the regrown second gate dielectric layer 18b may be formed of a silicon oxide dielectric material under circumstances where the patterned first gate electrode material layer 16 is formed of a doped polysilicon material and the semiconductor substrate 10 is formed of a doped monocrystalline silicon material. Typically and preferably, each of the conformal first planarizing stop layer 18a and the regrown second gate dielectric layer 18b is formed to a thickness of from about 10 to about 50 angstroms.

As is further understood by a person skilled in the art, although the schematic cross-sectional diagram of FIG. 3A illustrates the conformal first planarizing stop layer 18a and the regrown second gate dielectric layer 18b as being formed employing a thermal oxidation method, a functionally equivalent result in accord with the present invention may also be effected by depositing a blanket dielectric layer upon all exposed surfaces within the semiconductor integrated circuit microelectronic fabrication whose schematic cross-sectional diagram is illustrated in FIG. 2A to form thereupon a contiguous blanket conformal planarizing stop layer and redeposited second gate dielectric layer.

There is also shown within the schematic cross-sectional diagram of FIG. 3A, after having formed the conformal first planarizing stop layer 18a upon the patterned first gate electrode material layer 16 and the regrown second gate dielectric layer 18b upon the second active region 13a of the semiconductor substrate 10, a blanket second gate electrode material layer 20 formed upon exposed portions of the conformal second planarizing stop layer 18a, the isolation region 12b, the regrown second gate dielectric layer 18b and the isolation region 12c.

Within the preferred embodiment of the present invention, the blanket second gate electrode material layer 20 is typically and preferably formed employing methods and materials analogous or equivalent to the methods and materials employed for forming the patterned first gate electrode material layer 16 (and in particular co-deposition dopant incorporation methods, but preferably not ion implantation dopant incorporation methods), but to a generally greater thickness in a range of from about 500 to about 3000 angstroms. Within the preferred embodiments of the present invention, the blanket second gate electrode material layer 20 is most preferably formed of a doped polysilicon gate electrode material of polarity opposite the doped well region 11 and the patterned first gate electrode material layer 16.

Figure 3B:
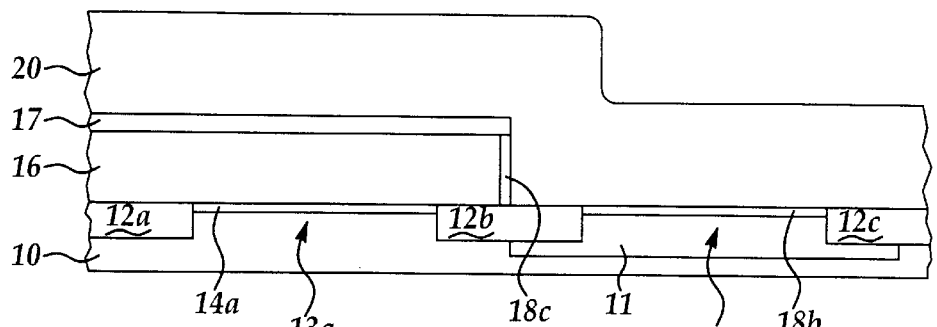

Referring now to FIG. 3B, there is shown the results of further processing of the semiconductor integrated circuit microelectronic fabrication whose schematic cross-sectional diagram is illustrated in FIG. 2B.

Shown in FIG. 3B is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2A, which is also in general related to the semiconductor integrated circuit microelectronic fabrication whose schematic cross-sectional diagram is illustrated in FIG. 2B, but wherein upon thermal oxidation there is provided a sidewall residue layer 18c adjoining the patterned first gate electrode material layer 16, rather than a conformal second planarizing stop layer 18a as illustrated within the schematic cross-sectional diagram of FIG. 2B.

As is understood by a person skilled in the art, the semiconductor integrated circuit microelectronic fabrication whose schematic cross-sectional diagram is illustrated in FIG. 3B provides advantage in comparison with the semiconductor integrated circuit microelectronic fabrication whose schematic cross-sectional diagram is illustrated in FIG. 3A insofar as the semiconductor integrated circuit microelectronic fabrication whose schematic cross-sectional diagram is illustrated in FIG. 3B provides means for an independent variation of thickness and materials composition of the regrown second gate dielectric layer 18b with respect to the patterned first planarizing stop layer 17.

Figure 4:
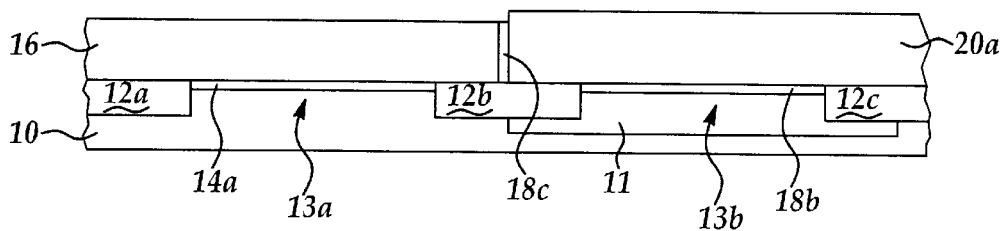

Referring now to FIG. 4, there is shown a schematic cross-sectional diagram illustrating the results of further processing of the semiconductor integrated circuit microelectronic fabrication whose schematic cross-sectional diagram is illustrated in FIG. 3A or FIG. 3B.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3A or FIG. 3B, but wherein, in a first instance, the blanket second gate electrode material layer 20 has been planarized to form a patterned planarized second gate electrode material layer 20a formed laterally adjacent but not over the patterned first gate electrode material layer 16.

Within the preferred embodiment of the present invention, the blanket second gate electrode material layer 20 may be planarized to form the patterned planarized second gate electrode material layer 20a laterally adjacent but not over the patterned first gate electrode material layer 16 while employing planarizing methods as are conventional in the art of semiconductor integrated circuit microelectronic fabrication. Such planarizing methods may include, but are not limited to, reactive ion etch (RIE) etchback planarizing methods, as well as (more preferably) chemical mechanical polish (CMP) planarizing methods.

Similarly, there is also shown within the schematic cross-sectional diagram of FIG. 4, in light of absence thereof, the results of subsequently optionally stripping from the semiconductor integrated circuit microelectronic fabrication whose schematic cross-sectional diagram is illustrated in FIG. 3A or FIG. 3B, after having planarized the blanket second gate electrode material layer 20 to form the patterned planarized second gate electrode material layer 20a either: (1) a portion of the patterned conformal first planarizing stop layer 18a as illustrated within the schematic cross-sectional diagram of FIG. 3A to leave reaming the sidewall residue layer 18c; or (2) the patterned first planarizing stop layer 17 as illustrated within the schematic cross-sectional diagram of FIG. 3B to leave remaining the sidewall residue layer 18c.

Within the preferred embodiments of the present invention, a portion of the patterned conformal first planarizing stop layer 18a, or the entirety of the patterned first planarizing stop layer 17, may be stripped from the patterned first gate electrode material layer 16 to leave remaining the sidewall residue layer 17 while employing stripping methods and materials as are otherwise conventional in the art of semiconductor integrated circuit microelectronic fabrication.

Figure 5:
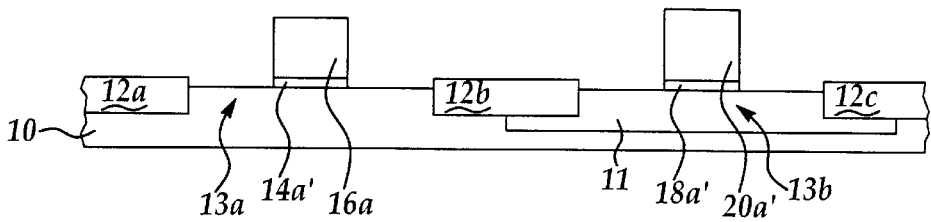

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there has been sequentially patterned: (1) the patterned first gate electrode material layer 16 and the patterned planarized second gate electrode material layer 20a to form a corresponding first gate electrode 16a and a corresponding second gate electrode 20a'; and (2) the first gate dielectric layer 14a and the regrown second gate dielectric layer 18b to form a corresponding patterned first gate dielectric layer 14a' and patterned regrown second gate dielectric layer 18b'.

Within the preferred embodiments of the present invention, the foregoing patterning of the patterned first gate electrode material layer 16, the patterned planarized second gate electrode material layer 20a, the first gate dielectric layer 14a and the regrown second gate dielectric layer 18b to form the corresponding first gate electrode 16a, second gate electrode 20a', patterned first gate dielectric layer 114a' and patterned regrown second gate dielectric layer 20a' may be effected while employing reactive ion etch (RIE) methods as are otherwise conventional in the art of semiconductor integrated circuit microelectronic fabrication.

Figure 6:
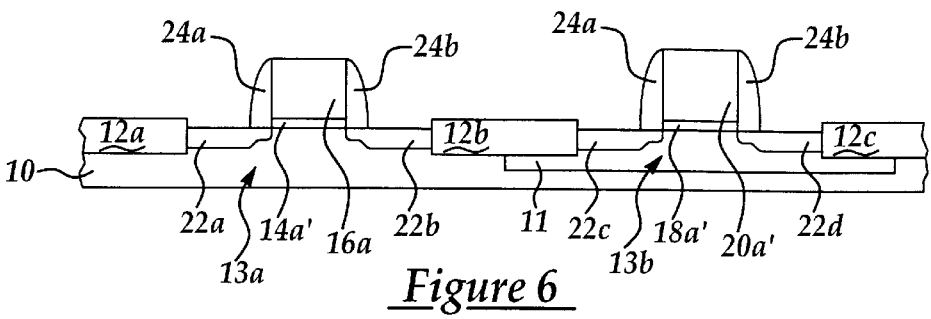

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein: (1) there is formed adjoining a series of sidewalls of: (1) the first gate electrode 16a and the patterned first gate dielectric layer 114a'; and (2) the second gate electrode 20a' and the patterned regrown second gate dielectric layer 18b', a series of spacer layers 24a, 24b, 24c and 24d. Similarly, there is also shown within the schematic cross-sectional diagram of FIG. 6, and formed into the portions of the first active region 13a of the semiconductor substrate 10 and the second active region 13b of the semiconductor substrate 10, at areas not covered by the first gate electrode 16a and the second gate electrode 20a', a series of source/drain regions 22a, 22b, 22c and 22d.

Within the preferred embodiment of the present invention, the series of spacer layers 24a, 24b, 24c and 24d, as well as the series of source/drain regions 22a, 22b, 22c and 22d, may be formed employing methods and materials as are otherwise generally conventional in the art of semiconductor integrated circuit microelectronic fabrication.

Upon forming the semiconductor integrated circuit microelectronic fabrication whose schematic cross-sectional diagram is illustrated in FIG. 6, there is fabricated a field effect transistor (FET) device within a semiconductor integrated circuit microelectronic fabrication, wherein the field effect transistor (FET) device is efficiently fabricated, with enhanced performance, within the semiconductor integrated circuit microelectronic fabrication.

The present invention realizes the foregoing object by employing, in part, a planarizing method for forming, in a self aligned fashion, a patterned second gate electrode material layer laterally adjacent but not over a patterned first gate electrode material layer, such that upon further patterning of the patterned first gate electrode material layer and the patterned second gate electrode material layer there may be formed a first gate electrode over a first active region of a semiconductor substrate and a second gate electrode over a laterally adjacent second active region of the semiconductor substrate. Similarly, by employing the foregoing planarizing method in accord with the present invention, each of a blanket first gate electrode material layer from which is formed the patterned first gate electrode material layer and a blanket second gate electrode material layer from which is formed the patterned second gate electrode material layer may be formed employing an in-situ deposition dopant incorporation method, rather than an ion implantation dopant incorporation method, such as to provide for enhanced performance of a pair of field effect transistor (FET) devices within which are fabricated the first gate electrode and the second gate electrode.

As is understood by a person skilled in the art, the preferred embodiments of the present invention are illustrative of the present invention rather than limiting of the present invention. Revisions and modifications may be made to methods, materials, structures and dimensions employed for fabricating a semiconductor integrated circuit microelectronic fabrication in accord with the preferred embodiments of the present invention, while still fabricating a semiconductor integrated circuit microelectronic fabrication in accord with the present invention, further in accord with the accompanying claims.

What is claimed is:

1. A method for fabricating a semiconductor integrated circuit microelectronic fabrication comprising:
    providing a semiconductor substrate having defined therein a first active region laterally adjacent a second active region;
    forming over the first active region but not over the second active region a patterned first gate electrode material layer having formed aligned thereupon a first planarizing stop layer;
    forming over the first planarizing stop layer and the second active region a blanket second gate electrode material layer;
    planarizing, while employing a planarizing method in conjunction with the planarizing stop layer, the blanket second gate electrode material layer to form therefrom a patterned second gate electrode material layer laterally adjacent but not over the patterned first gate electrode material layer; and
    further patterning the patterned first gate electrode material layer and the patterned second gate electrode material layer to form a corresponding first gate electrode over the first active region and a corresponding second gate electrode over the second active region.

2. The method of claim 1 wherein the semiconductor integrated circuit microelectronic fabrication is a complementary semiconductor integrated circuit microelectronic fabrication.

3. The method of claim 1 wherein the semiconductor integrated circuit microelectronic fabrication is a non-complementary semiconductor integrated circuit microelectronic fabrication.

4. The method of claim 1 wherein:
    the patterned first gate electrode material layer is formed to a thickness of from about 500 to about 3000 angstroms; and
    the blanket second gate electrode material layer is formed to a thickness of from about 500 to about 3000 angstroms.

5. The method of claim 1 wherein the patterned first gate electrode material layer and the blanket second gate electrode material layer are formed from a gate electrode material selected from the group consisting of metals, metal alloys, doped polysilicon and polycide gate electrode materials.

6. The method of claim 1 wherein the patterned first gate electrode material layer is formed at least in part of a first doped polysilicon gate electrode material and the blanket second gate electrode material layer is formed at least in part of a second doped polysilicon gate electrode material.

7. The method of claim 6 wherein each of the first doped polysilicon gate electrode material and the second doped polysilicon gate electrode material is formed employing a co-deposition dopant incorporation method.

8. The method of claim 6 wherein each of the first doped polysilicon gate electrode material and the second doped polysilicon gate electrode material is not formed employing an ion implantation dopant incorporation method.

9. The method of claim 1 wherein the planarizing method is selected from the group consisting of reactive ion etch etchback planarizing methods and chemical mechanical polish planarizing methods.

10. A method for fabricating a semiconductor integrated circuit microelectronic fabrication comprising:

provided a semiconductor substrate having defined therein a first active region of a first polarity laterally adjacent a second active region of a second polarity opposite the first polarity;

forming over the first active region but not over the second active region a patterned first gate electrode material layer of the second polarity, the patterned first gate electrode material layer having formed aligned thereupon a first planarizing stop layer;

forming over the first planarizing stop layer and the second active region a blanket second gate electrode material layer of the first polarity;

planarizing, while employing a planarizing method in conjunction with the planarizing stop layer, the blanket second gate electrode material layer to form therefrom a patterned second gate electrode material layer laterally adjacent but not over the patterned first gate electrode material layer; and further patterning the patterned first gate electrode material layer and the patterned second gate electrode material layer to form a corresponding first gate electrode over the first active region and a corresponding second gate electrode over the second active region.

11. The method of claim 10 wherein:

the patterned first gate electrode material layer is formed to a thickness of from about 500 to about 3000 angstroms; and the blanket second gate electrode material layer is formed to a thickness of from about 500 to about 3000 angstroms.

12. The method of claim 10 wherein the patterned first gate electrode material layer is formed at least in part of a first doped polysilicon gate electrode material and the blanket second gate electrode material layer is formed at least in part of a second doped polysilicon gate electrode material.

13. The method of claim 12 wherein each of the first doped polysilicon gate electrode material and the second doped polysilicon gate electrode material are formed employing a co-deposition dopant incorporation method.

14. The method of claim 12 wherein each of the first doped polysilicon gate electrode material and the second doped polysilicon gate electrode material is not formed employing an ion implantation dopant incorporation method.

15. The method of claim 10 wherein the planarizing method is selected from the group consisting of reactive ion etch etchback planarizing methods and chemical mechanical polish planarizing methods.

* * * * *